United States Patent
Yamaki et al.

(10) Patent No.: US 9,596,765 B2
(45) Date of Patent: Mar. 14, 2017

(54) MANUFACTURING METHOD FOR COMPONENT INCORPORATED SUBSTRATE AND COMPONENT INCORPORATED SUBSTRATE MANUFACTURED USING THE METHOD

(75) Inventors: Akira Yamaki, Ayase (JP); Tatsuya Kikuchi, Ayase (JP); Mitsuaki Toda, Ayase (JP)

(73) Assignee: MEIKO ELECTRONICS CO., LTD., Ayase-shi, Kanagawa (JP)

( * ) Notice: Subject to any disclaimer, the term of this patent is extended or adjusted under 35 U.S.C. 154(b) by 202 days.

(21) Appl. No.: 14/426,364

(22) PCT Filed: Sep. 11, 2012

(86) PCT No.: PCT/JP2012/073204
§ 371 (c)(1),
(2), (4) Date: Mar. 5, 2015

(87) PCT Pub. No.: WO2014/041601
PCT Pub. Date: Mar. 20, 2014

(65) Prior Publication Data
US 2015/0223343 A1     Aug. 6, 2015

(51) Int. Cl.
*H05K 3/30*     (2006.01)
*H05K 3/00*     (2006.01)
(Continued)

(52) U.S. Cl.
CPC ......... *H05K 3/0008* (2013.01); *C25D 7/0607* (2013.01); *H01L 21/6835* (2013.01);
(Continued)

(58) Field of Classification Search
None
See application file for complete search history.

(56) References Cited

U.S. PATENT DOCUMENTS

2007/0227761 A1   10/2007   Tuominen et al.
2014/0299367 A1*  10/2014   Imamura ................ H05K 1/188
                                                      174/260

FOREIGN PATENT DOCUMENTS

EP       1 770 776 A2    4/2007
JP      2005-159345 A    6/2005
(Continued)

OTHER PUBLICATIONS

Extended European Search Report for European Patent Application No. 12 88 4630, dated Apr. 25, 2016.
(Continued)

*Primary Examiner* — Dimary Lopez Cruz
*Assistant Examiner* — Roseline Alicea Rivera
(74) *Attorney, Agent, or Firm* — Marshall, Gerstein & Borun LLP

(57) ABSTRACT

A manufacturing method for a component incorporated substrate according to the present invention includes positioning an electronic component with reference to a mark formed on a copper layer, the mark consisting of a material less easily etched than copper by a copper etching agent used for etching of copper, after mounting the electronic component on the copper layer with an adhesive layer interposed therebetween, embedding the electronic component and the mark in an insulating substrate, thereafter, etching and removing a part of the copper layer to form a window for exposing the mark, forming an LVH reaching a terminal of the electronic component with reference to the exposed mark, electrically connecting the terminal and the copper layer via a conduction via formed by applying copper plating to the LVH, and, thereafter, forming the copper layer into a wiring pattern.

9 Claims, 10 Drawing Sheets

(51) Int. Cl.
| | | |
|---|---|---|
| H05K 1/18 | (2006.01) | |
| H05K 3/46 | (2006.01) | |
| H01L 23/00 | (2006.01) | |
| C25D 7/06 | (2006.01) | |
| H05K 1/09 | (2006.01) | |
| H05K 3/40 | (2006.01) | |
| H01L 23/544 | (2006.01) | |
| H01L 21/683 | (2006.01) | |
| H05K 1/02 | (2006.01) | |
| H01L 21/56 | (2006.01) | |

(52) U.S. Cl.
CPC ............ *H01L 23/544* (2013.01); *H01L 24/19* (2013.01); *H01L 24/82* (2013.01); *H01L 24/83* (2013.01); *H05K 1/0269* (2013.01); *H05K 1/09* (2013.01); *H05K 1/185* (2013.01); *H05K 1/188* (2013.01); *H05K 3/403* (2013.01); *H05K 3/4007* (2013.01); *H05K 3/4038* (2013.01); *H05K 3/4658* (2013.01); *H05K 3/4661* (2013.01); *H05K 3/4682* (2013.01); *H01L 21/568* (2013.01); *H01L 24/27* (2013.01); *H01L 24/29* (2013.01); *H01L 24/32* (2013.01); *H01L 24/92* (2013.01); *H01L 2221/68359* (2013.01); *H01L 2223/54426* (2013.01); *H01L 2223/54486* (2013.01); *H01L 2224/04105* (2013.01); *H01L 2224/2741* (2013.01); *H01L 2224/27436* (2013.01); *H01L 2224/2919* (2013.01); *H01L 2224/2929* (2013.01); *H01L 2224/29387* (2013.01); *H01L 2224/32245* (2013.01); *H01L 2224/82039* (2013.01); *H01L 2224/82132* (2013.01); *H01L 2224/83005* (2013.01); *H01L 2224/8314* (2013.01); *H01L 2224/83132* (2013.01); *H01L 2224/83192* (2013.01); *H01L 2224/92144* (2013.01); *H01L 2924/12042* (2013.01); *H01L 2924/14* (2013.01); *H05K 3/305* (2013.01); *H05K 3/4602* (2013.01); *H05K 3/4655* (2013.01); *H05K 2201/0209* (2013.01); *H05K 2201/0293* (2013.01); *H05K 2201/09063* (2013.01); *H05K 2201/09472* (2013.01); *H05K 2201/09918* (2013.01); *H05K 2203/0353* (2013.01); *H05K 2203/0361* (2013.01); *H05K 2203/063* (2013.01)

(56) References Cited

FOREIGN PATENT DOCUMENTS

| | | |
|---|---|---|
| JP | 2007088009 A | 4/2007 |
| JP | 2007-535156 A | 11/2007 |
| JP | 2010-027917 A | 2/2010 |
| JP | 2012-507154 A | 3/2012 |
| WO | WO-2009/101723 A1 | 8/2009 |
| WO | WO-2012/032654 A1 | 3/2012 |
| WO | WO-2012/042667 A1 | 4/2012 |

OTHER PUBLICATIONS

International Search Report for PCT/JP2012/073204, mailed Dec. 18, 2012.

Written Opinion for PCT/JP2012/073204, mailed Dec. 18, 2012.

\* cited by examiner

MANUFACTURING METHOD FOR COMPONENT INCORPORATED SUBSTRATE AND COMPONENT INCORPORATED SUBSTRATE MANUFACTURED USING THE METHOD

TECHNICAL FIELD

The present invention relates to manufacturing method for a component incorporated substrate in which electric or electronic components are embedded in a substrate and a component incorporated substrate manufactured using the method.

BACKGROUND ART

In recent years, according to an increase in density and improvement of functions of electronic circuit substrate, a component incorporated substrate having structure in which electronic components are embedded in an insulating substrate which is an insulating layer has been attracting attention (see, for example, Patent Document 1). In such a component incorporated substrate, a wiring pattern is formed on the surface of the insulating substrate. The component incorporated substrate can be used as a module with other various electronic components surface-mounted in predetermined positions of the wiring pattern. The component incorporated substrate can also be used as a core substrate in manufacturing a component incorporated multilayer circuit substrate with a build-up method.

In such a component incorporated substrate, it is necessary to provide a connecting section that electrically connects the wiring pattern on the surface of the insulating substrate and a terminal of an electronic component in the insulating substrate. As a conventional manufacturing method for a component incorporated substrate, first, a copper layer, which should be a wiring pattern, is formed on a supporting plate. A connecting section is formed in a predetermined position on the copper layer by solder paste. The electronic component is disposed such that the terminal is positioned on the connecting section. Subsequently, the connecting section and the electronic component are embedded by an insulating material, which becomes the insulating substrate. An intermediate product incorporating the electronic component is obtained. Thereafter, the supporting plate is peeled off the intermediate product. The exposed copper layer is formed into a wiring pattern having a predetermined shape, whereby a component incorporated substrate is obtained.

Incidentally, when the other various electronic components are surface-mounted on the surface of the component incorporated substrate, reflow soldering is performed. Therefore, the component incorporated substrate is exposed to high temperature equal to or higher than a melting temperature of solder every time the reflow soldering is performed. Therefore, it is likely that reliability of the connecting section between the wiring pattern and the terminal section of the electronic component is deteriorated.

Therefore, in the component incorporated substrate, in order to attain improvement of thermal reliability of the connecting section between the wiring pattern and the terminal section of the electronic component, it is conceivable to use, as a material forming such a connecting section, copper that has a high melting point compared with the solder and is less easily affected by heat in the reflow soldering. The connecting section formed using the copper is formed by, for example, after embedding the electronic component in the insulating substrate, providing a connection hole that extends from the wiring pattern on the substrate surface to the terminal of the electronic component in the substrate and filling the copper in the connection hole using a plating method. In this case, since the connection hole has to be accurately formed toward the terminal of the electronic component in the insulating substrate, in a manufacturing process, it is necessary to improve accuracy of positioning of the electronic component and accuracy of specifying of a terminal position. A form of a manufacturing method for a component incorporated substrate that attains improvement of these kinds of accuracy is explained below.

First, a supporting plate is prepared and a copper layer is formed on the supporting plate. A mark consisting of a columnar body of copper is formed on the copper layer by the plating method. Subsequently, an electronic component is positioned in a predetermined position on the copper layer with reference to the mark and fixed by an insulative adhesive. Thereafter, the fixed electronic component and the mark are covered with an insulating material to form an insulating layer as an insulating substrate embedded with the electronic component. Thereafter, the supporting plate is peeled to expose the copper layer. In the exposed copper layer, a portion where the mark is present is etched and removed, whereby the mark is exposed. A terminal position of the electronic component is specified with reference to the exposed mark. A connection hole reaching the terminal is formed. Thereafter, copper plating is applied to the entire copper layer including the connection hole to fill the connection hole with the copper, whereby the copper layer and the terminal are electrically connected. Finally, the copper layer on the surface of the insulating substrate is processed into a predetermined wiring pattern, whereby a component incorporated substrate is manufactured.

With the manufacturing method, since the same mark is used as a reference for the positioning of the electronic component and the specifying of the terminal position, it is possible to accurately perform the positioning of the electronic component and the specifying of the position of the terminal.

PRIOR ART DOCUMENT

Patent Document

Patent Document 1: Japanese Patent Application Laid-Open No. 2010-027917

SUMMARY OF THE INVENTION

Problems to be Solved by the Invention

Incidentally, in the manufacturing method explained above, after the supporting plate is peeled, when the copper layer in the portion where the mark is embedded is etched, the mark is sometimes etched together. Since the mark is formed by copper plating, there is slight variation in the thickness of the mark depending on a plating condition. Therefore, depending on a condition of the etching, it is likely that a thin portion of the mark is removed and the mark is chipped. It is also likely that the mark becomes extremely thin and a recess is formed in the mark portion. When the mark is chipped and the recess is formed in the mark portion, problems explained below occur. First, there is a problem in that a detection error of the mark increases in the detecting means and the terminal position of the electronic component cannot be accurately specified. Further, usually, a plurality of the component incorporated substrates are fabricated in a large-sized manufacturing panel and finally individually cut out and made into a product. When expansion and contraction of the substrate are taken into account, positioning accuracy of a mark for positioning is improved as the mark for positioning is provided in a place closer to a target of positioning. Therefore, it is preferable to provide the mark in the respective component incorporated substrates from the viewpoint of positioning accuracy improvement. However, if the mark portion recesses, such a recess becomes a defect and the quality of the component incorporated substrates is deteriorated. Therefore, the mark has to be formed in a frame portion other than the component incorporated substrates in the manufacturing panel. The positioning accuracy is sacrificed more or less.

In the manufacturing method explained above, when the electronic component is positioned, the position of the mark is detected by the detecting means. The electronic component is arranged in the predetermined position with reference to the position of the mark. The detecting means irradiates detection light on a detection region having a predetermined area and receives, with a light reception sensor, reflected light from a target object in the detection region to thereby recognize the target object. In this case, in order to improve accuracy of the detection of the light reception sensor, preprocessing for clarifying a difference in the intensity of the reflected light between the target object and a portion other than the target object is performed. Specifically, the entire copper layer is roughened with an etching agent in a state in which a masking tape is stuck to the mark. Consequently, although the surface of the copper layer is roughened, the surface of the mark can maintain a glossy surface. As a result, the contrast of the reflected light is made clear between the mark and the copper layer around the mark. Therefore, the detection accuracy of the light reception sensor is improved. The improvement of the detection accuracy can be attained.

However, the preprocessing requires complicated work for sticking the masking tape to the very small mark and, after the surface roughening is performed, peeling such a masking tape and is time-consuming. Therefore, there is a problem in that deterioration in manufacturing efficiency of the component incorporated substrate is caused.

The present invention has been devised in view of the above circumstances and it is an object of the present invention to provide a manufacturing method for a component incorporated substrate that can accurately perform positioning of a component and specifying of the position of the component while suppressing deterioration in manufacturing efficiency and a component incorporated substrate manufactured using the method.

Means for Solving the Problems

In order to attain such an object, according to the present invention, there is provided a manufacturing method for a component incorporated substrate in which, in an insulating substrate including a wiring pattern on the surface, an electric or electronic component including a terminal electrically connected to the wiring pattern is incorporated, the manufacturing method including: a mark forming step for forming a copper layer, which should be the wiring pattern, on a supporting plate and forming a mark on a second surface on the opposite side of a first surface in contact with the supporting plate of the copper layer; a component mounting step for positioning the component with reference to the mark and mounting the component on the second surface of the copper layer with an insulative adhesive layer interposed therebetween; an embedding layer forming step for forming, on the second surface of the copper layer on which the component is mounted, an embedding layer functioning as the insulating substrate in which the component and the mark are embedded; a window forming step for, after peeling the supporting plate off the copper layer, etching and removing, with a copper etching agent used for etching of copper, a part of the copper layer from the first surface side of the copper layer exposed by the peeling and forming a window for partially exposing the embedding layer together with the entire proximal end face of the mark which was in contact with the second surface of the copper layer before removing the part of the copper layer; a conduction via forming step for specifying the position of a terminal of the component with reference to the mark exposed from the window and, after forming a via hole reaching the terminal, filling a conductive material in the via hole and forming a conduction via for electrically connecting the terminal and the copper layer; and a pattern forming step for forming the copper layer electrically connected to the terminal via the conduction via into the wiring pattern. In the mark forming step, the mark is formed using an etching resistant material having greater etching resistance against etching by the copper etching agent than copper.

It is preferable that the manufacturing method further includes, before the component mounting step, a surface roughening step for applying surface roughening treatment to the second surface of the copper layer using the copper etching agent.

It is preferable to adopt a form in which, in the mark forming step, the mark consisting of a plated layer of nickel serving as the etching resistant material is formed by at least one of an electroless plating method and an electroplating method.

It is preferable to adopt a form in which a plated layer of gold serving as the etching resistant material is further provided on the plated layer of nickel by at least one of the electroless plating method and the electroplating method, and the mark is formed by a nickel-gold plated layer.

It is preferable to adopt a form in which, in the mark forming step, the mark consisting of a plated layer of silver serving as the etching resistant material is formed by at least one of an electroless plating method and an electroplating method.

It is preferable to adopt a form in which, in the mark forming step, the mark is formed by supplying a silver paste serving as the etching resistant material onto the copper layer.

According to the present invention, there is provided a component incorporated substrate manufactured using the manufacturing method for the component incorporated substrate explained above.

It is preferable that the component incorporated substrate according to the present invention includes: the mark embedded in the insulating substrate such that the proximal end face is flush with the surface of the insulating substrate; and a land for component mounting consisting of a copper plated layer formed on the proximal end face of the mark and having a flat surface.

It is preferable that the land for component mounting further includes a nickel plated layer formed on the copper plated layer and a gold plated layer formed on the nickel plated layer.

Advantageous Effects of the Invention

In the manufacturing method for the component incorporated substrate according to the present invention, in the mark forming step, the mark is formed using the etching resistant material. Therefore, effects explained below are attained. First, when a part of the copper layer is etched and removed in order to form the window, it is possible to suppress the mark from being etched together with the part of the copper layer. Consequently, since the mark is suppressed from being chipped, it is possible to reduce a detection error of the mark by a sensor and improve positioning accuracy of the incorporated component and the wiring pattern.

Since the etching of the mark is suppressed, a recess is not formed in the portion of the mark and the mark is flat. Therefore, it is possible to arrange the mark in each of a plurality of the component incorporated substrates arranged on a large-sized manufacturing panel while suppressing deterioration in quality. Consequently, since the mark can be formed in a position near a target object of positioning, highly accurate positioning is possible. Therefore, the present invention can also be adapted to a component further reduced in size in future.

The portion of the mark is flat as explained above. Therefore, it is possible to form the land for component mounting in this portion. Consequently, it is possible to use, as the land, a place where the mark is formed in the component incorporated substrate without wasting the place. The mark contributes to an increase in the density of the substrate.

Further, even when the surface roughening treatment of the copper layer is performed in order to make the contrast clear between the mark and the copper layer around the mark, since such a mark has etching resistance, it is unnecessary to stick the masking tape. Therefore, work for sticking the masking tape to and peeling the masking tape off the mark can be omitted. Therefore, it is possible to reduce a detection error of the mark by a sensor and attain improvement of the positioning accuracy of the component without deteriorating manufacturing efficiency of the component incorporated substrate.

Since the component incorporated substrate of the present invention is obtained by the manufacturing method explained above, the terminal of the incorporated component and the wiring pattern are highly accurately positioned, failures of electrical connection are extremely few, and the component incorporated substrate is excellent in quality.

MODE FOR CARRYING OUT THE INVENTION (First Embodiment)

In the present invention, first, a mark for positioning consisting of a columnar body made of copper is formed on a starting material (a mark forming step). The starting material is prepared, for example, as explained below.

Figure 1:
FIG. 1 is a sectional view schematically showing a supporting plate (a thin plate made of stainless steel) used in a manufacturing method for a component incorporated substrate according to an embodiment of the present invention.
Figure 2:
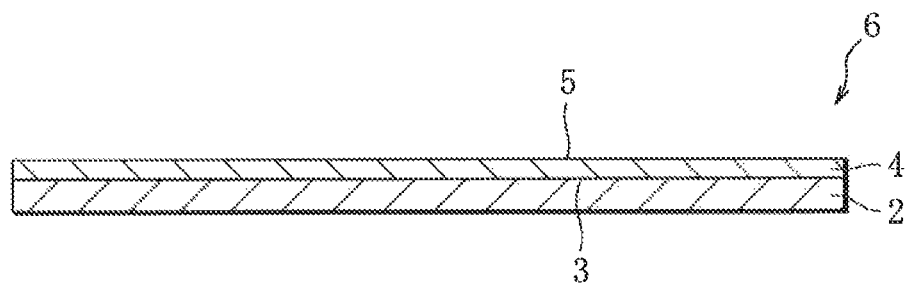
FIG. 2 is a sectional view schematically showing a copper-plated steel plate obtained by forming a copper layer on the supporting plate shown in FIG. 1.

First, as shown in FIG. 1, a supporting plate 2 is prepared. The supporting plate 2 is, for example, a thin plate made of stainless steel. As shown in FIG. 2, a first copper layer 4 consisting of a thin film is formed on the supporting plate 2. The first copper layer 4 consists of, for example, a copper plating film obtained by electroplating. A copper-plated steel plate 6 obtained in this way is used as a starting material. In the first copper layer 4, a surface in contact with the supporting plate 2 is represented as a first surface 3. A surface on the opposite side of the first surface 3 is represented as a second surface 5.

Note that, as the supporting plate 2, a thin plate made of aluminum can be used. In this case, the first copper layer 4 consists of, for example, a copper foil and is stuck to the surface of a thin plate made of aluminum.

Figure 3:
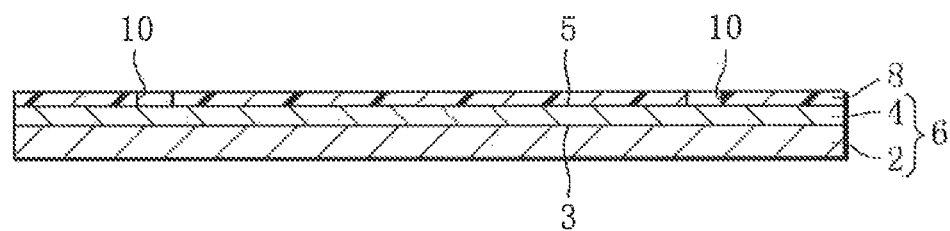
FIG. 3 is a sectional view schematically showing a state in which a plating resist film for pattern plating is formed on the copper layer of the copper-plated steel plate shown in FIG. 2.
Figure 4:
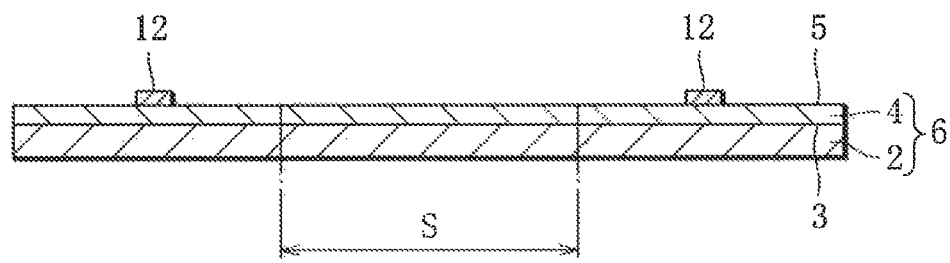
FIG. 4 is a sectional view schematically showing a state in which marks are formed on the copper layer of the copper-plated steel plate shown in FIG. 2.

Subsequently, as shown in FIG. 3, a mask layer 8 is formed on the first copper layer 4 of the prepared copper-plated steel plate 6. The mask layer 8 is, for example, a plating resist consisting of a dry film having predetermined thickness. Openings 10 are provided in predetermined positions of the mask layer 8. The copper layer 4 is exposed from the openings 10. By applying electroless plating of nickel to the copper-plated steel plate 6 including such a mask layer 8, the nickel is preferentially deposited in the exposed portion. Columnar nickel posts extending along the shape of the insides of the openings 10 are formed. Thereafter, when the dry film 8 is removed, the marks 12 for positioning consisting of the nickel post are formed in predetermined positions on the second surface 5 of the first copper layer 4 (FIG. 4). Note that a method of forming the mark 12 consisting of the nickel plated layer is not limited to the electroless plating method. An electroplating method can also be adopted. The electroplating method and the electroless plating method can also be concurrently used.

The setting position of the mark 12 can be arbitrarily selected. However, it is preferable to provide the mark 12 in a position where an optical system sensor of an optical system positioning device (not shown in the figure), which performs positioning of an electronic component (hereinafter referred to as intra-substrate component) 14 that should be incorporated in the insulating substrate, can easily recognize the mark 12. In this embodiment, as shown in FIG. 4, two marks 12 are formed across a mounting planned region S where the intra-substrate component 14 is planned to be mounted.

It is preferable to apply surface roughening treatment to the second surface 5 of the first copper layer 4 using a sulfuric acid-hydrogen peroxide-based copper etching agent among copper etching agents used for etching of copper. In this case, the marks consisting of nickel are not eroded because the marks have resistance against the sulfuric acid-hydrogen peroxide-based copper etching agent. It is possible to maintain a glossy surface. As a result, a contrast between the marks having glossiness and the roughened first copper layer 4 around the marks is made clear. The marks contribute to a reduction in a detection error of the optical sensor. Since the first copper layer 4 is roughened, in an embedding layer forming step, which is a later step, an anchor effect is exhibited between the insulating substrate and the first copper layer 4 and improvement of adhesion can be attained.

Subsequently, the intra-substrate component 14 is mounted on the copper-plated steel plate 6 via an adhesive 16 (a component mounting step).

Figure 5:
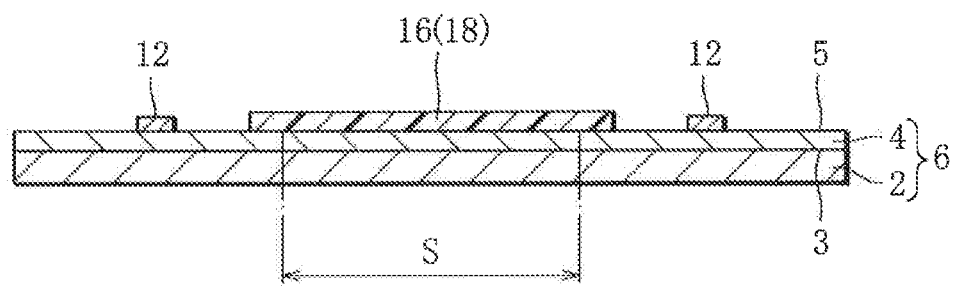
FIG. 5 is a sectional view schematically showing a state in which an adhesive is supplied onto the copper layer of the copper-plated steel plate shown in FIG. 4.

First, as shown in FIG. 5, the adhesive 16 is supplied to the mounting planned region S on the copper layer 4. The adhesive 16 only has to cover at least the entire mounting planned region S. Positioning accuracy of the adhesive 16 may be relatively low. When positioning of the adhesive 16 is performed, the mounting planned region S is specified with reference to the marks 12. The adhesive 16 is applied to a specified position. This is preferable because the positioning accuracy of the adhesive 16 is improved. Note that, if the adhesive 16 is appropriately disposed in a predetermined position corresponding to a position where a terminal of the intra-substrate component 14 is present, a form in which the adhesive 16 covers a part of the mounting planned region S may be adopted.

The adhesive 16 hardens and changes to an adhesive layer 18 having predetermined thickness. The adhesive layer 18 to be obtained fixes the intra-substrate component 14 in a predetermined position and has a predetermined insulation property. The adhesive 16 is not particularly limited as long as the adhesive 16 exhibits predetermined bonding strength and a predetermined insulation property after the hardening. However, an adhesive obtained by adding a filler to thermosetting epoxy resin or polyimide resin is used. As the filler, for example, fine powder of silica (silicon dioxide), glass fiber, or the like is used.

In the present invention, a form of the adhesive 16 supplied to the mounting planned region S is not particularly limited. A form may be adopted in which the adhesive 16 in a liquid state is applied at predetermined thickness. A form may be adopted in which the adhesive 16 of a sheet shape having predetermined thickness is placed. In this embodiment, an adhesive in a liquid state obtained by adding fine powder of silica to thermosetting epoxy resin is used.

Figure 6:
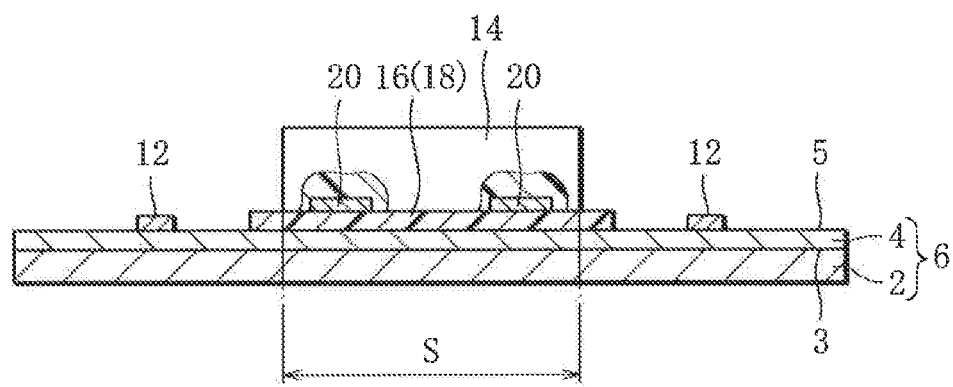
FIG. 6 is a sectional view schematically showing a state in which an electronic component is mounted on the adhesive of the copper-plated steel plate shown in FIG. 5.

Subsequently, as shown in FIG. 6, the adhesive 16 is applied to the mounting planned region S on the second surface 5 of the first copper layer 4. The intra-substrate component 14 is mounted on the adhesive 16. In this case, the intra-substrate component 14 is positioned in the mounting planned region S with reference to the mark 12. Thereafter, the adhesive 16 is heated using a thermosetting furnace or the like to harden and change to the adhesive layer 18. Consequently, the intra-substrate component 14 is fixed in the predetermined position.

Specifically, as it is evident from FIG. 6, the intra-substrate component 14 is a rectangular parallelepiped package component in which an IC chip or the like (not shown in the figure) is covered with resin. A plurality of terminals 20 are provided in a lower part of the package component. The adhesive layer 18 is interposed between the second surface 5 of the copper layer 4 and each of the intra-substrate component 14 and the terminals 20.

Subsequently, an insulating base material is stacked to embed the intra-substrate component 14 and the mark 12 (an embedding layer forming step).

Figure 7:
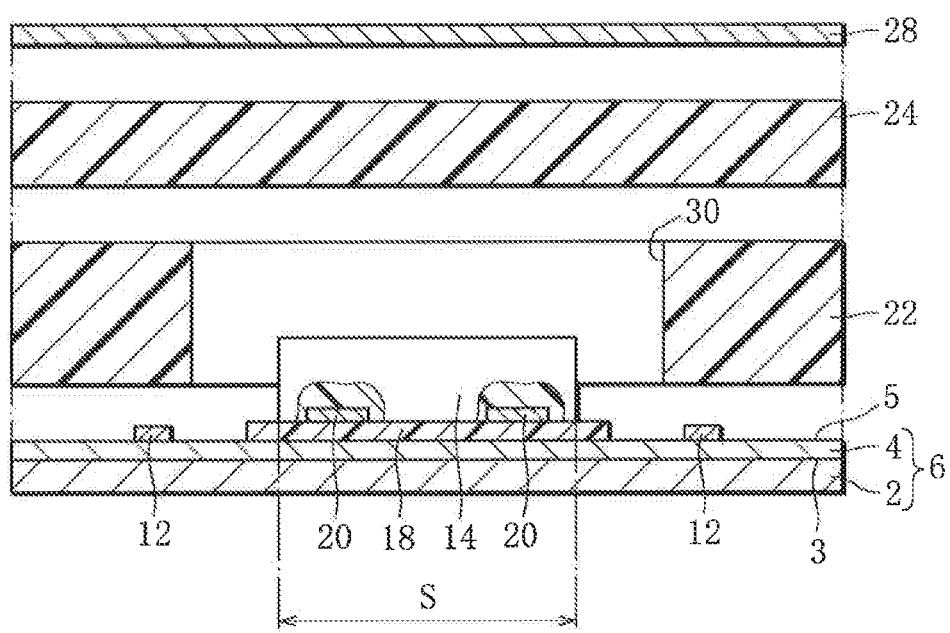
FIG. 7 is a sectional view schematically showing a state in which an insulating base material and a copper foil are stacked on the copper-plated steel plate on which the electronic component is mounted.

First, as shown in FIG. 7, first and second insulating base materials 22 and 24 are prepared. The insulating base materials 22 and 24 are made of resin. The insulating base materials 22 and 24 are so-called prepregs formed in a sheet shape obtained by impregnating thermosetting resin in an unhardened state in glass fiber. The first insulating base material 22 has a through-hole 30. An opening section of the through-hole 30 is formed in size for enabling insertion of the intra-substrate component 14. The height of the through-hole 30 (equivalent to the thickness of the insulating base material 22) is set larger than the height of the intra-substrate component 14. On the other hand, as shown in FIG. 7, the second insulating base material 24 is formed in a flat shape without a through-hole provided therein.

Subsequently, the first insulating base material 22 is stacked on the first copper layer 4. The second insulating base material 24 is superimposed on the upper side of the first insulating base material 22. A copper foil, which should be a second copper layer 28, is further superimposed on the upper side of the second insulating base material 24 to form a stacked body. The first insulating base material 22 is disposed such that the intra-substrate component 14 is located in the through-hole 30. Thereafter, so-called hot press for pressing and heating is applied to the entire stacked body.

Figure 8:
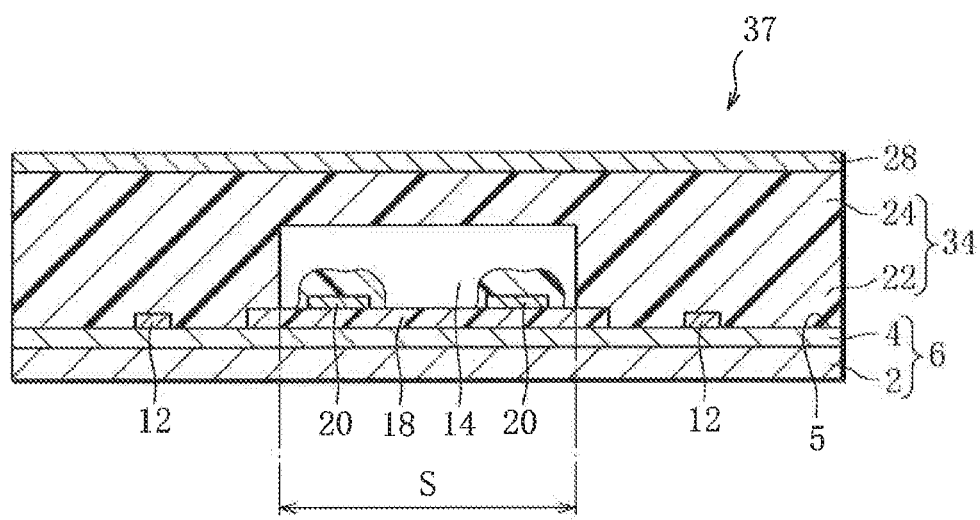
FIG. 8 is a sectional view schematically showing a state in which the insulating base material and the copper foil are stacked and integrated on the copper-plated steel plate on which the electronic component is mounted.

Consequently, after being pressurized and filled in a gap such as the through-hole 30, the thermosetting resin in the unhardened state of the prepregs is hardened by heat of the hot press. As a result, as shown in FIG. 8, an insulating substrate (an embedding layer) 34 consisting of the insulating base materials 22 and 24 is formed. In this way, a pressure-molded body 37 in which the intra-substrate component 14 is embedded in the insulating substrate 34 is obtained. Since the through-hole 30 is provided in the insulating base material 22 in advance, it is possible to avoid pressure applied to the intra-substrate component 14 when the hot press is performed. Therefore, it is possible to embed even the intra-substrate component 14 having large size in the insulating substrate without damaging the intra-substrate component 14.

Figure 9:
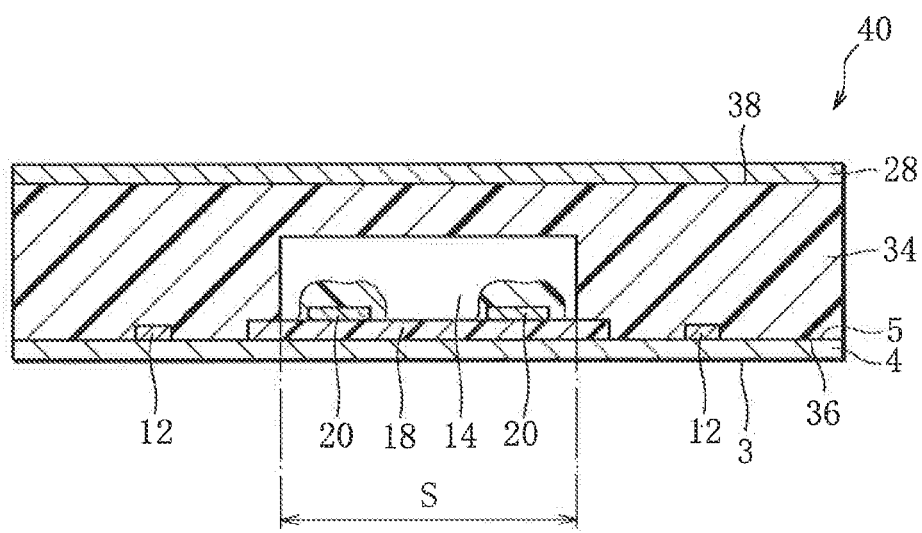
FIG. 9 is a sectional view schematically showing an intermediate product obtained by peeling the supporting plate off the copper layer.

Subsequently, as shown in FIG. 9, the supporting plate 2 is peeled off the pressure-molded body 37. Consequently, an intermediate product 40 of the component incorporated substrate is obtained. The intermediate product 40 includes the insulating substrate 34 including the intra-substrate component 14 on the inside, the first copper layer 4 formed on one surface (a lower surface) 36 of the insulating substrate 34, and the second copper layer 28 formed on the other surface (an upper surface) 38. In the first copper layer 4, the first surface 3 is exposed by the peeling of the supporting plate 2.

Subsequently, a predetermined part of the first copper layer 4 is removed to form a window in the obtained intermediate product 40 (a window forming step).

Figure 10:
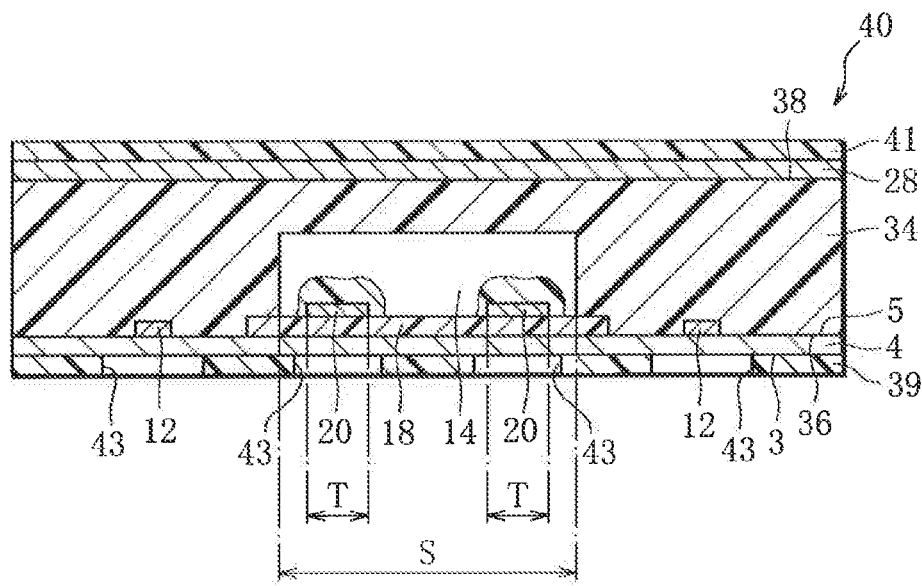
FIG. 10 is a sectional view schematically showing a state in which a mask layer is formed on the copper layer of the intermediate product shown in FIG. 9.

First, as shown in FIG. 10, mask layers 39 and 41 are formed on the surfaces of both the copper layers 4 and 28. The mask layers 39 and 41 are, for example, etching resists consisting of a dry film having predetermined thickness. Openings 43 are provided in predetermined positions. The first surface 3 of the copper layer 4 is exposed from the openings 43. The openings 43 are respectively provided in portions where the marks 12, 12 are present and portions (hereinafter referred to as terminal present sections) T, T where the terminals 20, 20 of the intra-substrate component 14 are present. For example, the portions where the marks 12, 12 are present and the terminal present sections T, T are specified with reference to the end portion of the insulating substrate 34. The openings 43 are formed in size larger than the marks 12, 12 and the terminals 20, 20 in the specified positions. Since the openings 43 are formed larger than the marks 12 and the terminals 20, accuracy in specifying the positions of the openings 43 may be relatively low.

Figure 11:
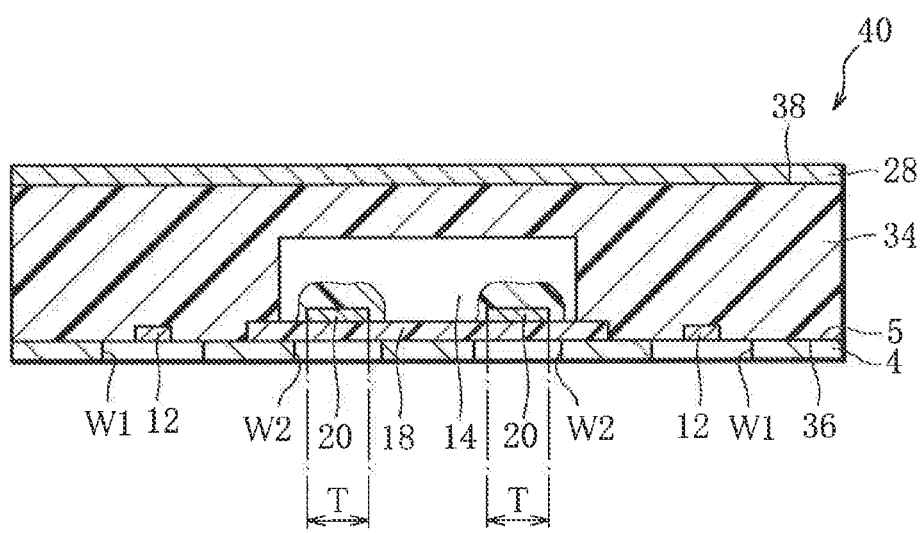
FIG. 11 is a sectional view schematically showing a state in which windows are formed in the intermediate product shown in FIG. 10.

Subsequently, the first copper layer 4 in the exposed portions is removed from the intermediate product 40 by a normal etching method using a copper etching agent consisting of a cupric chloride aqueous solution. Thereafter, the mask layers 39 and 41 are removed. Consequently, as shown in FIG. 11, first windows W1 for partially exposing the insulating substrate 34 together with the marks 12, 12 and second windows W2 for exposing the parts of the adhesive layer 18 including the terminal present sections T are formed. The windows W1 and W2 are modeled after the openings 43 and formed larger than the marks 12, 12 and the terminals 20, 20. Since the marks 12 consist of nickel, the marks 12 exhibit resistance against the cupric chloride aqueous solution. Therefore, erosion of the marks 12 is suppressed when the etching is performed. That is, after the first copper layer 4 is etched and removed in the portion of the first window W1, even if the marks 12 are exposed, a deficiency in which the marks 12 are eroded and chipped and recessed does not occur. Note that the copper etching agent is not limited to the cupric chloride aqueous solution. A ferric chloride aqueous solution is also used. The nickel exhibits resistance against the ferric chloride aqueous solution as well.

Subsequently, via holes are formed in the adhesive layer 18 of the terminal present sections T (a via hole forming step).

Figure 12:
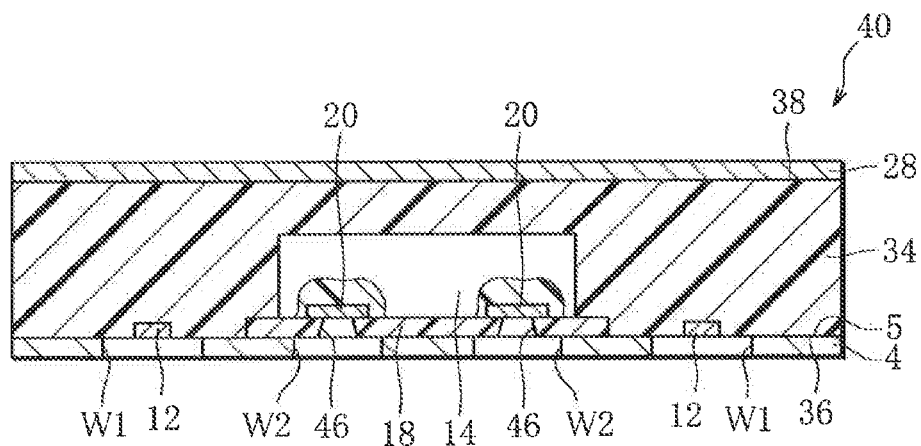
FIG. 12 is a sectional view schematically showing a state in which laser via holes are formed in the intermediate product shown in FIG. 11.

First, the exposed marks 12, 12 are recognized by the optical system sensor of the optical system positioning device (not shown in the figure). The positions of the terminals 20 of the intra-substrate component 14 hidden by the adhesive layer 18 are specified with reference to the positions of the marks 12, 12. Thereafter, a laser, for example, a carbon dioxide laser is irradiated on the adhesive layer 18 in the specified terminal positions to remove the adhesive layer 18. As shown in FIG. 12, laser via holes (hereinafter referred to as LVHs) 46 reaching the terminals 20 are formed. Consequently, the terminals 20 of the intra-substrate component 14 are exposed. The windows W1 and W2 are formed larger than the marks 12, 12 and the terminals 20, 20. Therefore, in the first windows W1, the entire marks 12, 12 can be recognized. In the second windows W2, the laser can be efficiently irradiated on target parts without being reflected by the copper layer 4.

As it is evident from the forms explained above, the present invention is characterized in that the marks 12, 12 used for the positioning of the intra-substrate component 14 are used for the formation of the LVHs 46 again. That is, in the present invention, since the marks common to the positioning of the intra-substrate component 14 and the positioning of the LVHs 46 are used, it is possible to exhibit extremely high positioning accuracy. It is possible to form the LVHs 46 in accurate positions with respect to the terminals 20 hidden by the adhesive layer 18.

Subsequently, after a resin residue is removed from the intermediate product 40, in which the LVHs 46 are formed, by desmear treatment, plating treatment is applied to the intermediate product 40 to deposit copper on the surface of the intermediate product 40. The copper is filled in the LVHs 46. Consequently, conduction vias that electrically connect the terminals 20 of the intra-substrate component 14 and the first copper layer 4 are formed (a conduction via forming step).

Figure 13:
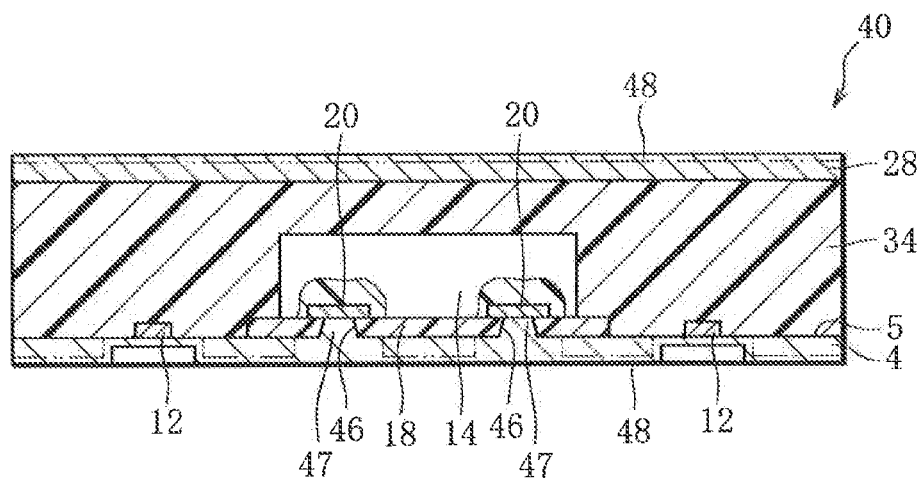
FIG. 13 is a sectional view schematically showing a state in which plating treatment is applied to the intermediate product shown in FIG. 12.

First, electroless plating treatment of copper is applied to the insides of the LVHs 46 to cover the inner wall surfaces of the LVHs 46 and the surfaces of the terminals 20 of the intra-substrate component 14. Thereafter, electroplating treatment of copper is applied to grow, as shown in FIG. 13, a plated layer 48 of copper that covers the entire first copper layer 4 and the entire second copper layer 28 including the LVHs 46. Consequently, the LVHs 46 are filled with copper and conduction vias 47 are formed. The conduction vias 47 are integrated with the first copper layer 4. The terminals 20 of the intra-substrate component 14 and the first copper layer 4 are electrically connected.

Subsequently, a part of the first copper layer 4 and the second copper layer 28 on the surface of the insulating substrate 34 is removed to form predetermined wiring patterns 50 (a pattern forming step).

Figure 14:
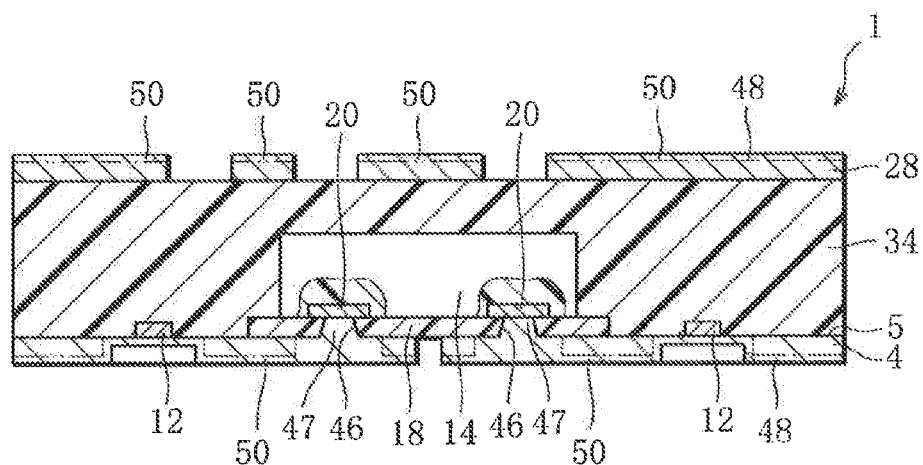
FIG. 14 is a sectional view showing a state in which wiring patterns are formed on the intermediate product shown in FIG. 13.

For the removal of a part of both the copper layers 4 and 28, the normal etching method is used. Consequently, as shown in FIG. 14, the predetermined wiring patterns 50 are formed on the surface of the insulating substrate 34.

Figure 15:
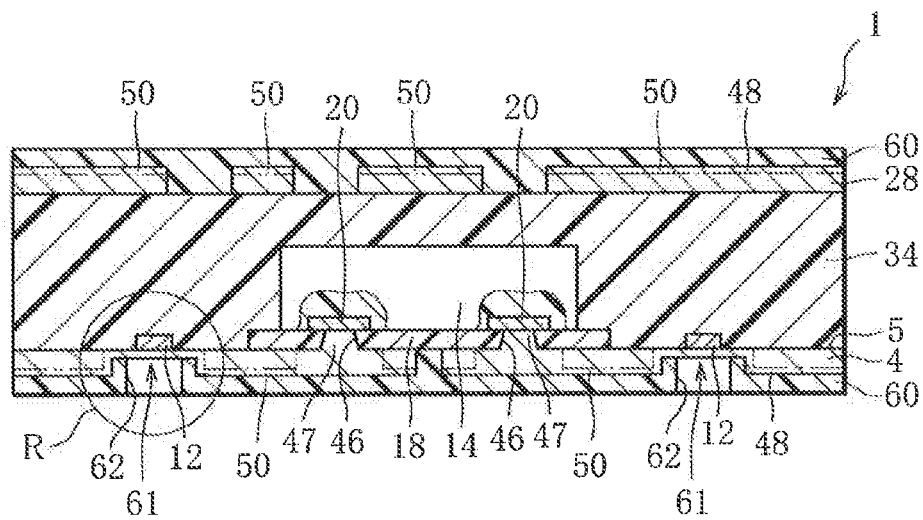
FIG. 15 is a sectional view schematically showing a component incorporated substrate according to an embodiment of the present invention.
Figure 16:
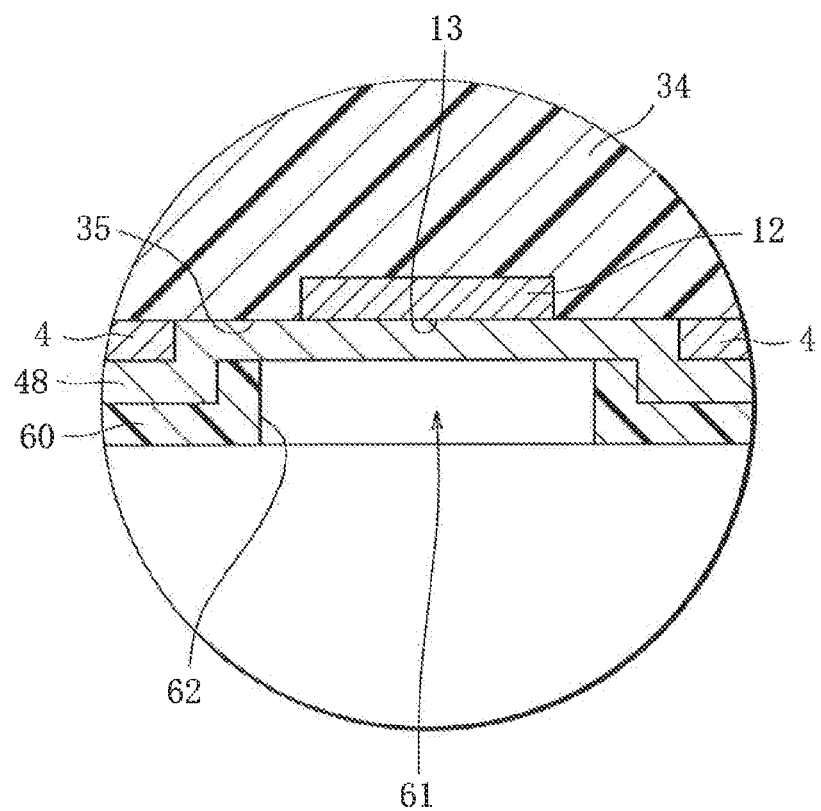
FIG. 16 is a sectional view showing an enlarged view of the circle R in FIG. 15.

After the wiring patterns 50 are formed, a solder resist is applied to a portion where adhesion of solder is desired to be avoided on the surface of the insulating substrate 34. Consequently, a solder resist layer 60 is formed on the surface of the insulating substrate 34. In this embodiment, as shown in FIG. 15, the solder resist is not applied to the portions of the marks 12. Openings 62 are provided in the solder resist layer 60. As a result, the portions of the plated layer 48 of copper corresponding to the portions of the marks 12 are exposed and change to lands for component mounting 61. More specifically, as shown in FIG. 16, since the mark 12 has the etching resistance, the mark 12 is not etched together with the copper layer 4 in the window forming step. Therefore, the mark 12 maintains a flat state of the proximal end face 13 thereof. That is, the proximal end face 13 of the mark 12 is flush with a surface 35 of the insulating substrate 34. A copper plated layer 48 is formed on the mark 12 in this state and the surface of the insulating substrate 34. Therefore, the copper plated layer 48 in this portion is also flat. The solder resist 60 is not applied to the copper plated layer 48 in this flat portion and an opening 62 is provided, whereby the portion is formed into a land for component mounting 61. In this way, since a chip and a recess do not occur in the portion of the mark 12, it is possible to form the land for component mounting 61 in such a portion. Therefore, it is possible to utilize the portion of the mark 12 without wasting the portion. That is, the mark 12 according to the present invention contributes to an increase in the density of the substrate as well.

As explained above, a component incorporated substrate 1 is obtained in which, in the insulating substrate 34 including the predetermined wiring patterns 50 on the surface, the intra-substrate component 14 including the terminals 20 electrically connected to the wiring patterns 50 is incorporated.

The component incorporated substrate 1 obtained in this way can be formed as a module substrate by surface-mounting other electronic components on the surface. The component incorporated substrate 1 can also be used as a core substrate to form a multilayer circuit substrate using a normally-performed build-up method.

Note that, in the first embodiment, the second windows are formed together with the first windows in the window forming step. However, the present invention is not limited to such a form. A form for forming only the first windows may be adopted. In this case, the positions of the terminals 20 of the component 14 are specified with reference to the marks 12 exposed from the first windows. The adhesive layer 18 including the copper layer 4 is removed to form via holes using, for example, a copper direct method.

Next, second to fifth embodiments are explained. In explaining the embodiments, concerning steps same as the steps already explained, detailed explanation of the steps is omitted. Constituent members and parts that exhibit functions same as the functions of the constituent members and the parts explained above are denoted by the same reference numerals and signs and explanation of the constituent members and the parts is omitted.

(Second Embodiment)

A second embodiment is different from the first embodiment only in that a mark 12 is formed by a nickel-gold plated layer in the mark forming step in the first embodiment.

In the mark forming step in the second embodiment, first, electroless plating of nickel is applied to the copper-plated steel plate 6 including the mask layer 8 to form nickel plated layers in the openings 10. Thereafter, electroless plating of gold is applied onto such a nickel plated layer to form the marks 12 consisting of a nickel-gold plated layer. Note that a method of forming the marks 12 consisting of the nickel-gold plated layer is not limited to an electroless plating method. An electroplating method can also be adopted. The electroless plating method and the electroplating method can also be used together.

(Third Embodiment)

A third embodiment is different from the first embodiment only in that the marks 12 are formed by a silver plated layer in the mark forming step in the first embodiment.

In a mark forming step in the third embodiment, electroless plating of silver is applied to the copper-plated steel plate 6 including the mask layer 8 to form the marks 12 consisting of a silver plated layer. Note that a method of forming the marks 12 consisting of the silver plated layer is not limited to an electroless plating method. An electroplating method can also be adopted. The electroless plating method and the electroplating method can also be used together.

(Fourth Embodiment)

A fourth embodiment is different from the first embodiment only in that the marks 12 are formed using silver paste in the mark forming step in the first embodiment.

In a mark forming step in the fourth embodiment, silver paste obtained by dispersing silver powder serving as a conductive filler in an organic binder is prepared. The silver paste is screen-printed on the first copper layer 4. Consequently, posts consisting of the silver paste are formed in predetermined positions on the first copper layer 4. Thereafter, the copper-plated steel plate 6, on which the posts of the silver paste are placed, is retained under a temperature atmosphere of 100 to 180° C. for 10 to 60 minutes, whereby the silver paste is hardened and formed into the marks 12.

(Fifth Embodiment)

A fifth embodiment is different from the first embodiment only in that, when the land for component mounting is formed in the first embodiment, a nickel plated layer 64 is formed on the copper plated layer 48 and a gold plated layer 66 is further formed on the nickel plated layer 64.

Figure 17:
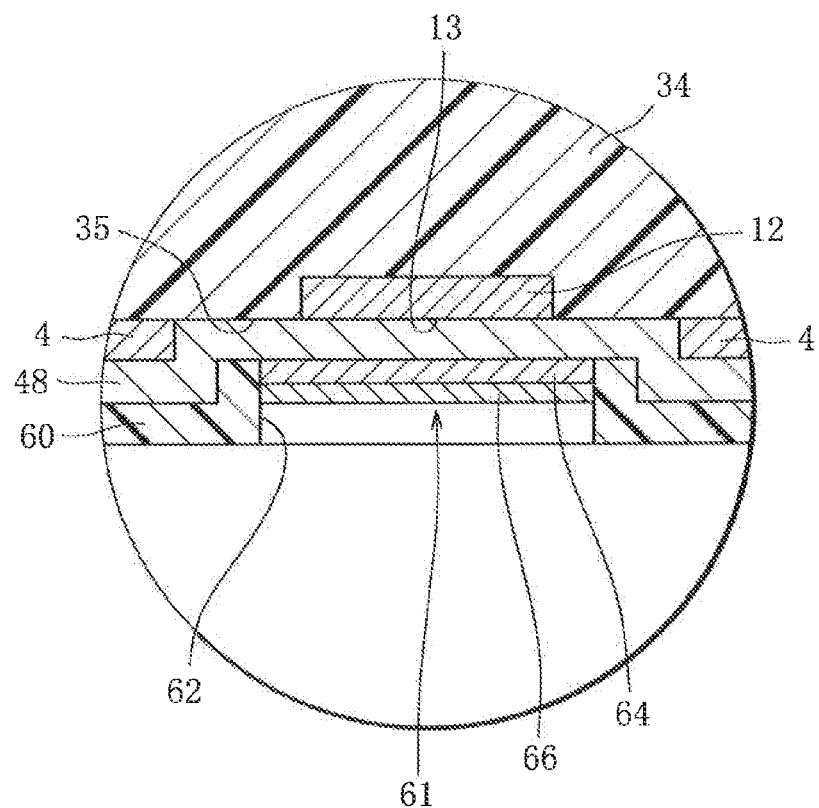
FIG. 17 is a sectional view of another embodiment corresponding to FIG. 16.

In the fifth embodiment, as shown in FIG. 17, the copper plated layer 48 in the land for component mounting 61 is covered by the nickel plated layer 64 and the gold plated layer 66 having etching resistance. Therefore, improvement of corrosion resistance of the land for component mounting 61 is attained.

As explained above, the marks 12 in the first to fifth embodiments consist of nickel, nickel-gold, silver, or silver paste. All of the marks 12 have greater etching resistance against erosion by the copper etching agents such as the sulfuric acid-hydrogen peroxide-based etching agent, the cupric chloride aqueous solution, and the ferric chloride aqueous solution, than copper. Therefore, in the surface roughening of copper and the etching of copper, the marks 12 are not eroded together with copper. That is, the marks 12 can maintain the initial shape. The marks 12 contribute to improvement of the positioning accuracy of the component and the accuracy of specifying of the terminal position.

Note that, in the present invention, the component incorporated in the insulating substrate is not limited to the package component. Other various electronic components such as a chip component can be components incorporated in the insulating substrate.

EXPLANATION OF REFERENCE SIGNS

1 Component incorporated substrate
2 Supporting plate
3 First surface
4 First copper layer
5 Second surface
6 Copper-plated steel plate
8 Mask layer
12 Marks
14 Electronic component (intra-substrate component)
16 Adhesive
18 Adhesive layer
20 Terminals
34 Insulating substrate
40 Intermediate product
46 Laser via holes (LVHs)
47 Conduction vias
50 Wiring patterns
S Mounting planned region
T Terminal present sections

The invention claimed is:
1. A manufacturing method for a component incorporated substrate in which, in an insulating substrate including a wiring pattern on a surface, an electric or electronic com- ponent including a terminal electrically connected to the wiring pattern is incorporated, the manufacturing method comprising:

a mark forming step for forming a copper layer, which should be the wiring pattern, on a supporting plate and forming a mark on a second surface on an opposite side of a first surface in contact with the supporting plate of the copper layer;

a component mounting step for positioning the component with reference to the mark and mounting the component on the second surface of the copper layer with an insulative adhesive layer interposed therebetween;

an embedding layer forming step for forming, on the second surface of the copper layer on which the component is mounted, an embedding layer functioning as the insulating substrate in which the component and the mark are embedded;

a window forming step for, after peeling the supporting plate off the copper layer, etching and removing, with a copper etching agent used for etching of copper, a part of the copper layer from the first surface of the copper layer exposed by the peeling and forming a window for partially exposing the embedding layer together with an entire proximal end face of the mark which was in contact with the second surface of the copper layer before removing the part of the copper layer;

a conduction via forming step for specifying a position of a terminal of the component with reference to the mark exposed from the window and, after forming a via hole reaching the terminal, filling a conductive material in the via hole and forming a conduction via for electrically connecting the terminal and the copper layer; and a pattern forming step for forming the copper layer electrically connected to the terminal via the conduction via into the wiring pattern, wherein in the mark forming step, the mark is formed using an etching resistant material having greater etching resistance against etching by the copper etching agent than copper.

2. The manufacturing method for the component incorporated substrate according to claim 1, wherein the manufacturing method further includes, before the component mounting step, a surface roughening step for applying surface roughening treatment to the second surface of the copper layer using the copper etching agent.

3. The manufacturing method for the component incorporated substrate according to claim 1, wherein, in the mark forming step, the mark consisting of a plated layer of nickel serving as the etching resistant material is formed by at least one of an electroless plating method and an electroplating method.

4. The manufacturing method for the component incorporated substrate according to claim 3, wherein a plated layer of gold serving as the etching resistant material is further provided on the plated layer of nickel by at least one of the electroless plating method and the electroplating method, and the mark is formed by a nickel-gold plated layer.

5. The manufacturing method for the component incorporated substrate according to claim 1, wherein, in the mark forming step, the mark consisting of a plated layer of silver serving as the etching resistant material is formed by at least one of an electroless plating method and an electroplating method.

6. The manufacturing method for the component incorporated substrate according to claim 1, wherein, in the mark forming step, the mark is formed by supplying a silver paste serving as the etching resistant material onto the copper layer.

7. A component incorporated substrate manufactured using the manufacturing method according to claim 1.

8. The component incorporated substrate according to claim 7, comprising: the mark embedded in the insulating substrate such that the proximal end face is flush with a surface of the insulating substrate; and a land for component mounting consisting of a copper plated layer formed on the proximal end face of the mark and having a flat surface.

9. The component incorporated substrate according to claim 8, wherein the land for component mounting further includes a nickel plated layer formed on the copper plated layer and a gold plated layer formed on the nickel plated layer.

* * * * *